United States Patent
Yamashita (10) Patent No.: US 9,276,559 B2
(45) Date of Patent: Mar. 1, 2016

(54) INDUCED SIGNAL REMOVING CIRCUIT

(75) Inventor: Hiroshi Yamashita, Nagasaki (JP)

(73) Assignee: Audio-Labo Corporation, Nagasaki (JP)

( * ) Notice: Subject to any disclaimer, the term of this patent is extended or adjusted under 35 U.S.C. 154(b) by 413 days.

(21) Appl. No.: 13/980,377

(22) PCT Filed: Jan. 27, 2012

(86) PCT No.: PCT/JP2012/000516
§ 371 (c)(1),
(2), (4) Date: Jul. 18, 2013

(87) PCT Pub. No.: WO2012/102051
PCT Pub. Date: Aug. 2, 2012

(65) Prior Publication Data
US 2013/0301853 A1 Nov. 14, 2013

(30) Foreign Application Priority Data
Jan. 28, 2011 (JP) .................. 2011-016337

(51) Int. Cl.
*H03H 11/00* (2006.01)
*H04R 3/00* (2006.01)

(52) U.S. Cl.
CPC ............. *H03H 11/00* (2013.01); *H04R 3/00* (2013.01); *H04R 2400/00* (2013.01)

(58) Field of Classification Search
CPC ...... H04R 3/00; H04R 2400/00; H03H 11/00; G05F 1/10
USPC .................. 381/96, 111, 117; 330/75, 85, 82
See application file for complete search history.

(56) References Cited

U.S. PATENT DOCUMENTS

| | | | | |
|---|---|---|---|---|
| 4,243,839 A | * | 1/1981 | Takahashi | H04R 3/002 381/96 |
| 4,256,923 A | * | 3/1981 | Meyers | H04R 3/002 381/96 |
| 5,245,296 A | * | 9/1993 | Miller | H04R 5/04 330/102 |
| 5,542,001 A | * | 7/1996 | Reiffin | H04R 3/002 381/400 |

(Continued)

FOREIGN PATENT DOCUMENTS

JP    2010-093593    4/2010

*Primary Examiner* — Vivian Chin
*Assistant Examiner* — David Ton
(74) *Attorney, Agent, or Firm* — Whitham, Curtis, Christofferson & Cook, P.C.

(57) ABSTRACT

[Object] To provide an induced signal removing circuit that feeds back induced voltage regarded as electrical signals into the input side of an inductive load to remove the induced voltage from the metal part, the induced voltage appearing even across an insulated metal part in response to signals input to the inductive load.
[Solution to Problem] An induced signal removing circuit for removing induced signals generated in a metal part in response to electrical signals input to an inductive load, including: an input terminal connected to the metal part insulated from the inductive load, the input terminal receiving the induced signals; two output terminals connected to an input side of the inductive load, the input side receiving the electrical signals, the output terminals outputting the induced signals received from the input terminal; and a signal flow controller between the input terminal and each output terminal, the controller causing the induced signals to flow in only one direction from the input terminal to either output terminal.

7 Claims, 6 Drawing Sheets

(56) References Cited

U.S. PATENT DOCUMENTS

| | | | | |
|---|---|---|---|---|
| 8,401,207 B2* | 3/2013 | Stanley | ............... | H03F 1/32 333/102 |
| 2006/0029238 A1* | 2/2006 | Kushida | ............ | H04R 3/002 381/111 |
| 2007/0159134 A1* | 7/2007 | Yamashita | ............ | H02H 9/047 320/109 |
| 2009/0067643 A1* | 3/2009 | Ding | ............... | H04R 3/002 381/96 |

\* cited by examiner

INDUCED SIGNAL REMOVING CIRCUIT

TECHNICAL FIELD

The present invention relates to an induced signal removing circuit that feeds back induced voltage in the form of electrical signals into the input signal of an inductive load to remove the induced voltage from the metal part. The induced voltage appears even across an insulated metal part in response to signals input to the inductive load.

BACKGROUND ART

In an electronic or electrical circuit using an inductive load (inductance), signals input to the inductive load generate voltage by electromagnetic induction even across an adjacent metal part insulated from the inductive load. Such induced voltage varies according to signals input to the inductive load. A potential difference caused by induced voltage generates current flow. Such induced current or voltage, which may cause an electric shock, is unnecessary for the operation of the electrical circuit and thus is removed by the grounding method in conventional electrical circuits (see Patent Literature 1, for example).

CITATION LIST

Patent Literature

[Patent Literature 1] Japanese Unexamined Patent Application Publication No. 2010-093593

In a conventional grounding method, a metal part where induced voltage may be generated is grounded or connected to a metal part of the housing of the electrical circuit by lead lines, such as a grounding conductor, to have zero potential, i.e., ground potential or the same potential as the housing. With such a method, induced voltage is undetectable with a measuring device and thus is regarded as "removed". Actually, the grounding method does not completely remove induced voltage from the electrical circuit. Specifically, the grounding method only removes voltage of static electricity. Induced voltage that acts like electrical signals in response to varying input signals is just absorbed by a ripple filter for the power supply or instantaneously discharged through the housing. This reduces the potential difference and makes the induced voltage undetectable with a measuring device.

In a conventional grounding method, a metal part is electrically charged due to induced voltage. In this state, potential difference generates induced current. The mechanical motion of the metal part acting like a solenoid generates counter induced voltage at the inductive load even when the metal part is only weakly charged. Such counter induced voltage, which is called "counter electromotive force" in electric motors, acts as energy that inhibits intended operation. Induced voltage, which is unavoidable during use of the inductive load, should preferably be removed immediately after its generation.

SUMMARY OF INVENTION

Technical Problem

It is an object of the present invention to solve the above problems by providing an induced signal removing circuit that can remove induced voltage across a metal part insulated from an inductive load.

Solution to Problem

The invention relates to an induced signal removing circuit for removing induced signals generated in a metal part in response to electrical signals input to an inductive load, including: an input terminal connected to the metal part insulated from the inductive load, the input terminal receiving the induced signals; two output terminals connected to an input side of the inductive load, the output terminal receiving the induced signals and outputting the induced signals, the input receiving electrical signals; and a signal flow controller between the input terminal and each output terminal, the controller causing the induced signals to flow in only one direction from the input terminal to each output terminal.

Advantageous Effects of Invention

The present invention readily removes induced signals at a metal part insulated from an inductive load in an electrical circuit, leading to a smooth and efficient operation of the electrical circuit and preventing an electric shock caused by induced voltage.

DESCRIPTION OF EMBODIMENTS

Figure 1:
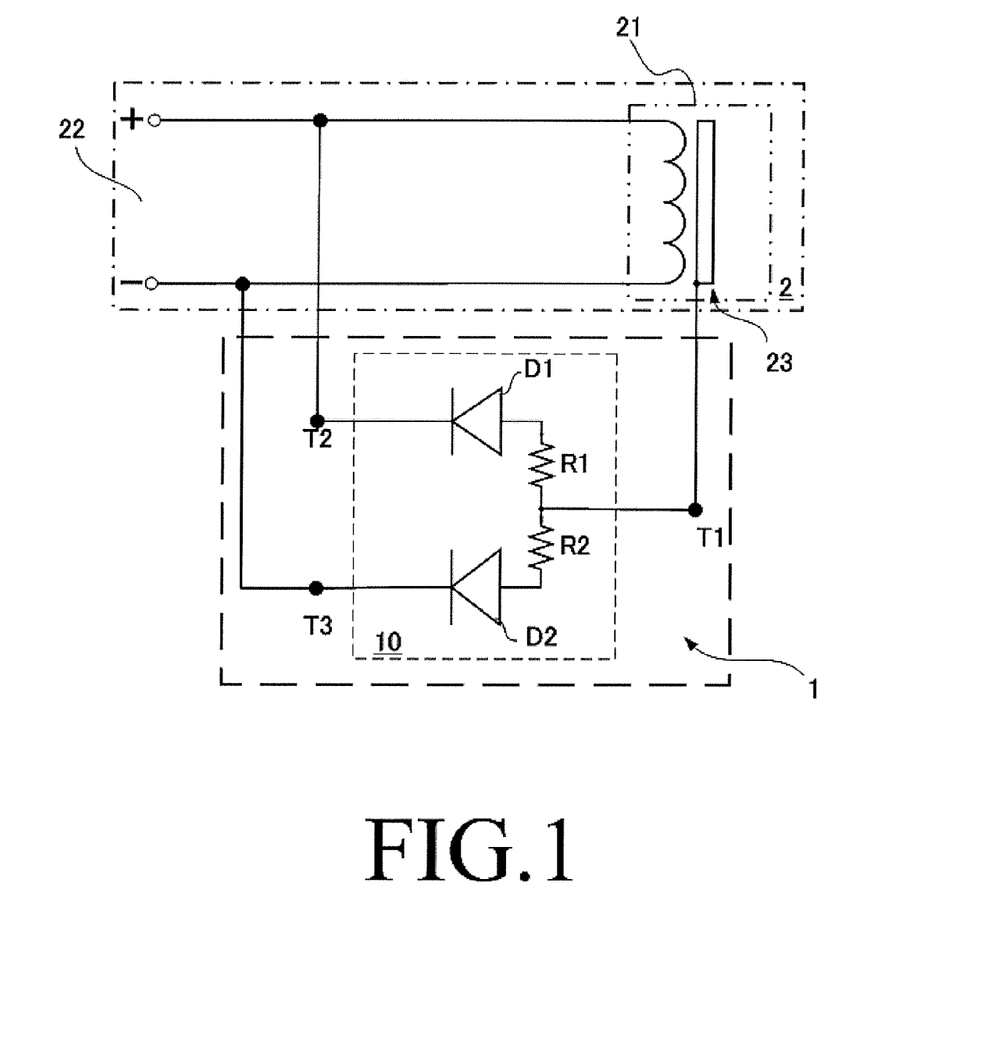
FIG. 1 is a circuit diagram illustrating an example electrical circuit including an induced signal removing circuit of the invention.

Embodiments of an induced signal removing circuit of the invention will now be described with reference to the attached drawings. FIG. 1 is a circuit diagram of an example induced signal removing circuit according to the invention. In FIG. 1, an induced signal removing circuit 1 of the invention is connected to an electrical circuit 2. The induced signal removing circuit 1 includes one input terminal T1 and two output terminals T2 and T3. A signal flow controller 10 is provided between the input terminal T1 and the output terminal T2 and between the input terminal T1 and the output terminal T3. Electrical signals (induced signals) input to the induced signal removing circuit 1 via the input terminal T1 flow (are output) to the output terminal T2 or T3 in accordance with the signal flow controller 10.

The signal flow controller 10 includes a rectifier that forces induced signals from the input terminal T1 to flow to the output terminal T2 or T3. The signal flow controller 10 controls the flow direction of positive induced signals from the input terminal T1 such that they are not output from the output terminal T3 but from the output terminal T2. On the contrary, the signal flow controller 10 controls the flow direction of negative induced signals from the input terminal T1 such that they are not output from the output terminal T2 but from the output terminal T3. As shown in FIG. 1, the signal flow controller 10 consists of two diodes D1 and D2 serving as a rectifier. The signal flow controller 10 may consist of any element other than diodes that can control signal flow in the above manner.

In the signal flow controller 10 in FIG. 1, the cathode of the diode D1 corresponds to the output terminal T1, while the cathode of the diode D2 corresponds to the output terminal T3. A protective resistor R1 is provided between the anode of the diode D1 and the input terminal T1. A protective resistor R2 is provided between the anode of the diode D2 and the input terminal T1. The input terminal T1 is connected to the node of the resistors R1 and R2.

The induced signals, which are transient, may cause a sudden flow of high current. The protective resistors R1 and R2 are used to protect the diodes D1 and D2 from excessively high input signals, i.e., induced signals. The protective resistors R1 and R2 are not necessarily provided if damage to the diodes D1 and D2 is avoidable. The protective resistors R1 and R2 preferably have the same resistance.

In FIG. 1, the reference numeral 2 represents an electrical circuit connected to the induced signal removing circuit 1. FIG. 1 only shows typical components: an input terminal 22 of the electrical circuit 2 to input signals to the inductive load 21; and a metal part 23 generating induced signals in response to the input signals. The input terminal 22 to input signals to the inductive load 21 consists of positive (+) and negative (−) terminals.

The input terminal T1 of the induced signal removing circuit 1 is connected to the metal part 23 generating induced signals caused by the inductive load 21 in the electrical circuit 2. The output terminal T2 is connected to a positive signal line while the output terminal T3 is connected to a negative signal line for signals to the inductive load 21 (input signals actuating the inductive load). Positive (+) signals from the input terminal 22 of the electrical circuit 2 pass through the inductive load 21 from the positive electrode to the negative electrode. If signals from the input terminal 22 of the electrical circuit 2 are negative (−), current flows through the inductive load 21 from the negative electrode to the positive electrode.

The direction of a signal input to the electrical circuit 2 determines the polarity of an induced signal generated in the metal part 23. A negative induced signal input to the induced signal removing circuit 1 passes through the diode D1 and then is output from the output terminal T2. The induced signal from the output terminal T2 is fed to the positive signal line in the electrical circuit 2. A positive induced signal generated in the metal part 23 is input to the induced signal removing circuit 1, passes through the diode D2, and then is output from the output terminal T3. The induced signal from the output terminal T3 is fed to the negative signal line in the electrical circuit 2.

As described above, the input terminal T1 of the induced signal removing circuit 1 is connected to the metal part of the inductive load 21, i.e., to a variable potential part due to electromagnetic induction caused by signals input to the inductive load 21. The output terminals T1 and T2 of the induced signal removing circuit 1 are connected to the respective signal lines (or input terminals) that receive signals for actuating the inductive load 21. Thus, induced signals based on variable potential due to electromagnetic induction can be fed to the input side receiving signals for actuating the inductive load 21. This removes induced signals generated in the metal part 23.

The operation of the induced signal removing circuit 1 of this embodiment will now be described in detail in which the inductive load 21 is based on a solenoid mechanism, and the metal part 23 is a plunger in cooperation with the solenoid mechanism. Signals from the input terminal 22 cause the metal part 23 to operate in a predetermined manner. The metal part 23 linearly moves by means of a solenoid that converts electric energy into linear motion. The metal part 23 linearly moves in a magnetic field generated by current flowing through a coil in the inductive load 21. Consequently, signals from the input terminal 22 generate induced voltage in the metal part 23. Such linear motion of the metal part 23 with induced voltage in the coil generates counter electromotive force.

The counter electromotive force causes current to flow in the direction opposite to that of kinetic energy generated by signals from the input terminal 22. For this reason, the metal part 23 is connected to the input terminal T1 of the induced signal removing circuit 1, and the output terminals T2 and T3 of the induced signal removing circuit 1 are connected to the respective signal input lines of the solenoid, i.e., the inductive load 21. This allows a variation in the voltage across the metal part 23 due to induction to be processed in the signal flow controller 10 and then appear at the output terminal T2 or T3 in the form of a signal. Thus, the induced signal removing circuit 1 superimposes induced signals generated in the inductive load 21 on signals to be input to the inductive load 21. Such action allows the metal part 23 to have substantially zero potential. This prevents the generation of counter electromotive force and leads to efficient operation of the solenoid. Note that feeding induced signals to the inductive load 21 via the input terminal barely affects a unit (e.g., a power supply) that supplies signals actuating the inductive load 21.

Figure 2:
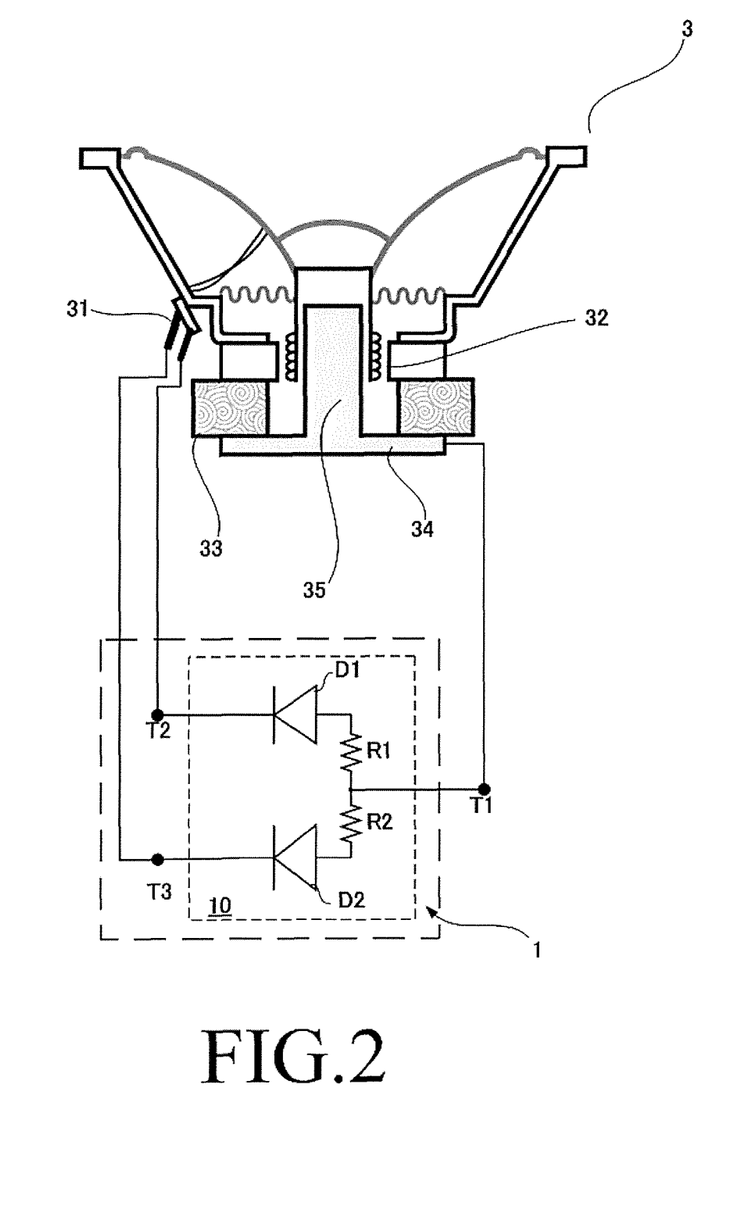
FIG. 2 is a schematic view of the induced signal removing circuit used as a speaker.

An example operation of an induced signal removing circuit 1 with an inductive load being a speaker will now be described. In FIG. 2, a speaker 3 can emit sound by oscillating its cone in response to the vertical oscillation (in the drawing) of a coil cap to which the voice coil 32 is fixed. The vertical oscillation results from a magnetic field generated by a magnet around the voice coil 32 and current flowing through the voice coil 32 in response to signals from an input terminal 31.

The magnet 33 is in contact with a yoke 34 and a pole piece 35. The yoke 34 and pole piece 35 are made of metals. The yoke 34 and the pole piece 35 are disposed such that the magnetic field generated by the magnet 33 works efficiently according to the voice coil 32. As stated above, upon reception of an electrical signal from the input terminal 31, the coil 32 vertically oscillates. The resulting current flows through the coil and generates a magnetic field that acts on metal parts, i.e., the yoke 34 and the pole piece 35. This generates electromagnetically induced voltage in the metal parts. The induced voltage provides a force that moves the voice coil 32 in the direction opposite to the direction in which the voice coil 32 is moved by signals from the input terminal 31. Thus, such induced voltage inhibits the motion of a diaphragm that emits sound based on signals from the input terminal 31.

To avoid such a phenomenon, the yoke 34 or pole piece 35, or both is connected to the input terminal T1 of the induced signal removing circuit 1. The output terminal T2 of the induced signal removing circuit 1 is connected to one end of the input terminal 31 of the speaker, whereas the output terminal T3 is connected to the other end of the input terminal 31 of the speaker.

A positive input signal fed to the speaker 3 generates induced voltage in the yoke 34 or pole piece 35. The induced voltage signal (induced signal) input, for example, from the input terminal T1 passes through the diode D1, is output from the output terminal T2, and then is input to the input terminal 31 of the speaker 3. If the input signal is negative, an induced signal from the input terminal T1 passes through the diode D2, is output from the output terminal T3, and then is input to the input terminal 31 of the speaker 3. Induced signals are transient in response to variations in the input signals as described later, and thus do not greatly vary the input signals. Induced signals therefore do not cause noise mixed in the sound from the speaker 3.

Thus, the induced signal removing circuit 1 of the invention efficiently removes induced signals in an electrical circuit including an inductive load. The removal of the induced signals enables the inductive load to operate accurately in response to the input signals.

Figure 3A:
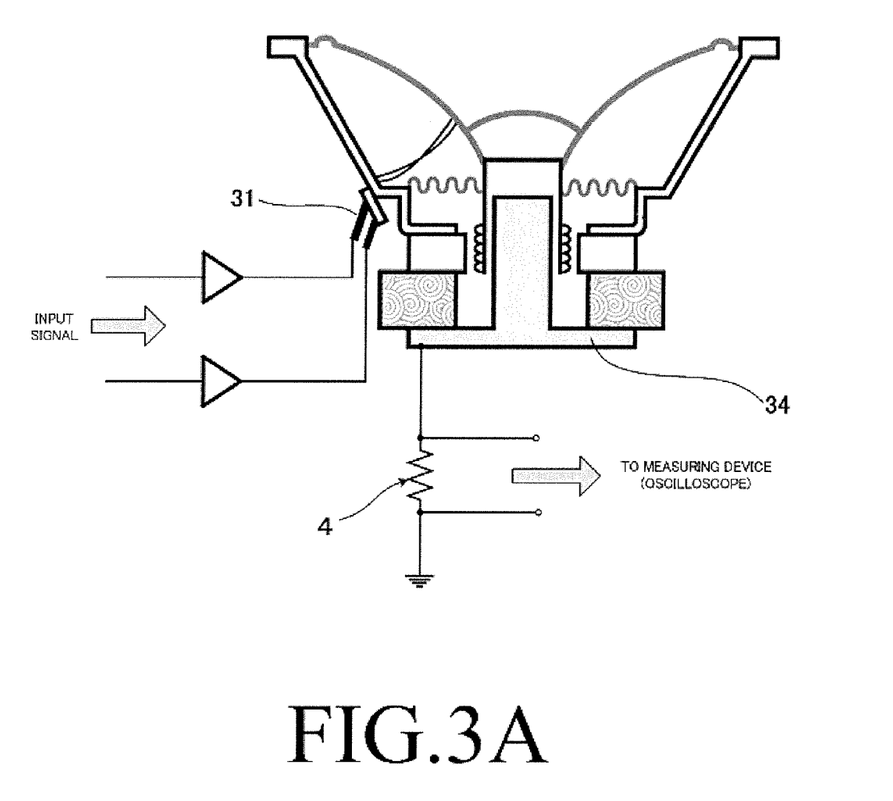
FIGS. 3A and 3B illustrate an advantage of the induced signal removing circuit.

How to remove induced signals with the induced signal removing circuit of the invention will now be described in detail with reference to drawings. FIGS. 3A and 3B schematically show how to measure the induced signals. In FIG. 3A, the inductive load corresponds to the speaker 3. The yoke 34, which is a metal part of the speaker 3, is grounded via a resistor 4. This configuration causes induced signals in the metal part to pass to the ground via the resistor 4. For this reason, a measuring device, e.g. an oscilloscope connected to the resistor 4 can measure the induced signals.

Figure 3B:
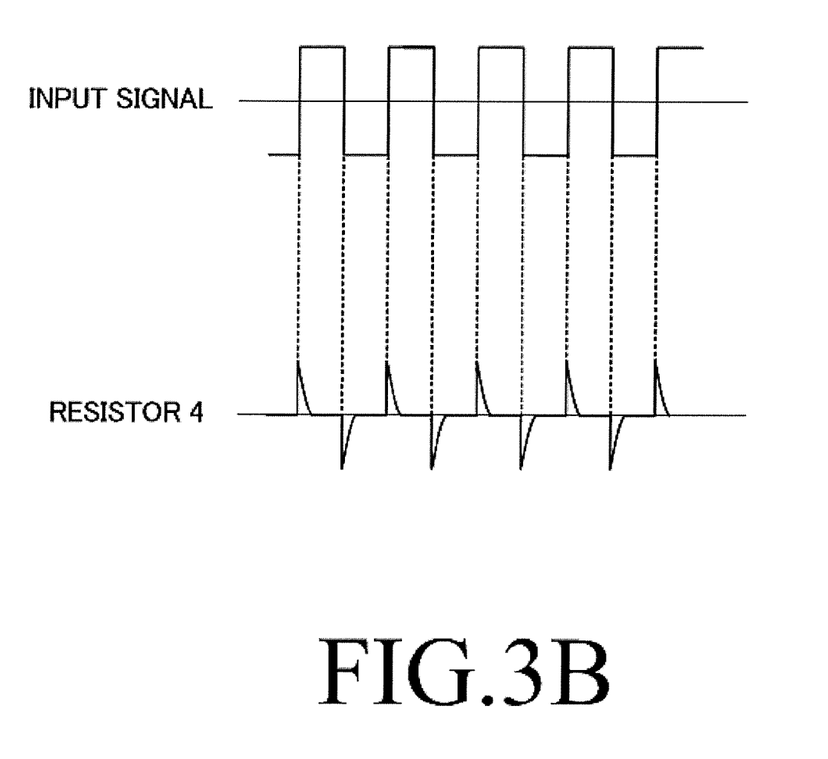

If the speaker 3 receives an input signal (rectangular wave) as shown in FIG. 3B, the voltage across the resistor 4 is observed as a differentiated signal of the input signal. Note that the resistor 4 has a resistance of approximately 1 MΩ. The signal shown in FIG. 3B that is observed at the resistor 4 corresponds to an induced signal. An induced signal is transient and decreases to zero in a certain period. Variations in the signal occur while the signal transiently decreases. During such a transient period, energy occurs that inhibits the above-described desired operation.

Figure 4A:
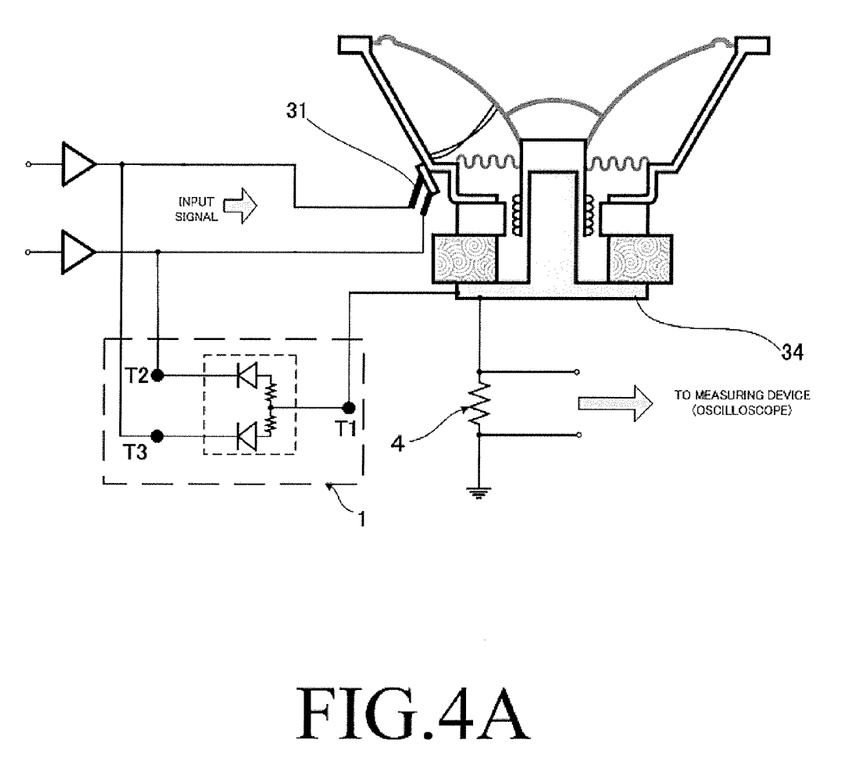
FIGS. 4A and 4B illustrate an advantage of the induced signal removing circuit.
Figure 4B:
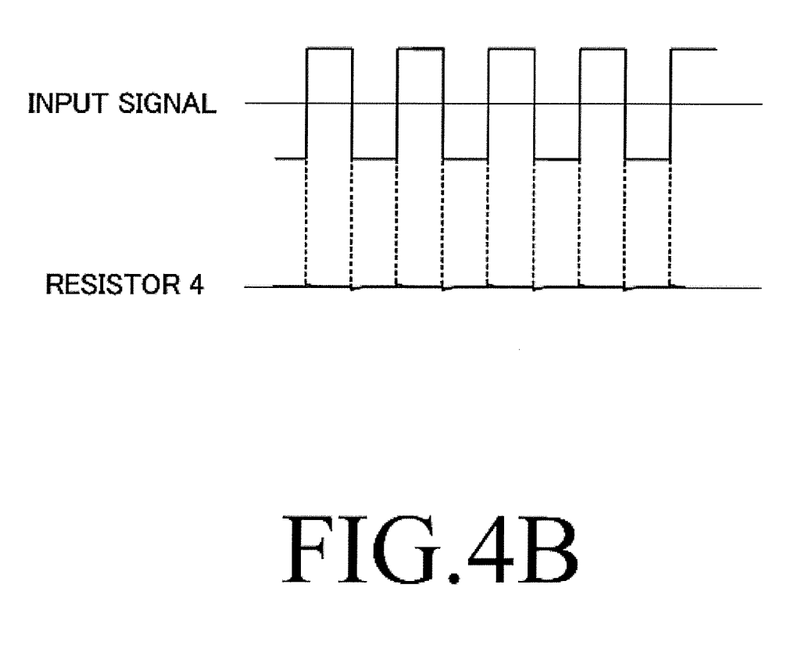

To solve such a problem, as shown in FIG. 4, the induced signal removing circuit 1 is connected to the inductive load, i.e., the speaker. As shown in FIG. 4A, the input terminal T1 of the induced signal removing circuit 1 is connected to the yoke 34. The output terminal T2 is connected to one input terminal of the speaker 3, whereas the output terminal T3 is connected to the other input terminal of the speaker 3. Consequently, as shown in FIG. 4B, a rectangular wave does not substantially cause measurable voltage across the resistor 4. This is because a transient induced signal exceeding a predetermined value passes through the diode D1 or D2 depending on its polarity, and then to the input terminal 31. Since the minimum voltage applied to a diode is commonly 0.6 V, an induced signal of 0.6 V or higher generated from an input signal passes to the signal input terminal via the induced signal removing circuit 1. Specifically, the induced signal removing circuit 1 feeds back induced signals, which inhibit the intended operation of the inductive load, into the input side of the inductive load, thus removing the induced signals.

Thus, the induced signal removing circuit of the invention used in an electric device with a coil and a metal part can feed back induced signals generated in the metal part from signals input to the coil, into the input side of the inductive load, i.e., the source of induced signals, unlike a conventional measure which sends such induced signals to another metal part or grounding conductor.

REFERENCE SIGNS LIST

1 induced signal removing circuit
10 signal flow controller

The invention claimed is:

1. An induced signal removing circuit for removing induced signals generated in a metal part in response to electrical signals input to an inductive load, comprising:

an input terminal connected to the metal part insulated from the inductive load, the input terminal receiving the induced signals;

two output terminals connected to an input side of the inductive load, the input side receiving the electrical signals, the output terminals outputting the induced signals received from the input terminal; and a signal flow controller between the input terminal and each output terminal, the controller causing the induced signals to flow in only one direction from the input terminal to either output terminal.

2. The induced signal removing circuit according to claim 1, wherein the signal flow controller causes the induced signal to flow to only one of the two output terminals depending on a polarity of the induced signal.

3. The induced signal removing circuit according to claim 1, wherein the two output terminals are connected to the respective signal flow controllers.

4. The induced signal removing circuit according to claim 1, wherein the signal flow controller comprises a rectifying semiconductor element.

5. The induced signal removing circuit according to claim 1, wherein
the signal flow controller comprises a resistor and a rectifying semiconductor element, and
the resistor is connected between the input terminal and the semiconductor element.

6. The induced signal removing circuit according to claim 1, wherein
the metal part is a pole piece or yoke in an audio speaker,
the input terminal is connected to the pole piece or yoke,
the output terminals are connected to an input side of the speaker, and
induced signals generated in the pole piece or yoke in response to electrical signals input to the speaker are input to the input terminal and output from the output terminals to superimpose the induced signals on electrical signals to be input to the speaker, thereby removing the induced signals from the pole piece or yoke.

7. The induced signal removing circuit according to claim 1, wherein
the metal part is a plunger of a solenoid mechanism,
the input terminal is connected to the plunger,
the output terminal is connected to an input side of the solenoid, and
induced signals generated in the plunger in response to actuation signals input to the solenoid mechanism are input to the input terminal and output from the output terminals to superimpose the induced signals on actuation signals to be input to the solenoid, thereby removing the induced signals from the plunger.

* * * * *